(12) United States Patent
Lee et al.

(10) Patent No.: US 8,188,578 B2
(45) Date of Patent: May 29, 2012

(54) SEAL RING STRUCTURE FOR INTEGRATED CIRCUITS

(75) Inventors: Tung-Hsing Lee, Taipei County (TW); Tien-Chang Chang, Hsinchu (TW); Yuan-Hung Chung, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 619 days.

(21) Appl. No.: 12/273,552

(22) Filed: Nov. 19, 2008

(65) Prior Publication Data

US 2009/0294929 A1    Dec. 3, 2009

Related U.S. Application Data

(60) Provisional application No. 61/057,185, filed on May 29, 2008.

(51) Int. Cl.
| H01L 23/552 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 31/00 | (2006.01) |
| H01L 23/58 | (2006.01) |
| H01L 29/06 | (2006.01) |

(52) U.S. Cl. ........ 257/659; 257/401; 257/409; 257/452; 257/490; 257/618; 257/E29.012; 257/E29.013; 257/E29.12

(58) Field of Classification Search ............... 257/401, 257/409, 452, 490, 496, 618, E29.012, E29.013, 257/E29.12
See application file for complete search history.

(56) References Cited

U.S. PATENT DOCUMENTS

| 5,475,255 | A | * | 12/1995 | Joardar et al. | 257/547 |
|---|---|---|---|---|---|
| 5,859,450 | A | * | 1/1999 | Clark et al. | 257/233 |
| 6,100,118 | A | | 8/2000 | Shih | |
| 6,492,716 | B1 | * | 12/2002 | Bothra et al. | 257/678 |
| 6,537,849 | B1 | * | 3/2003 | Tsai et al. | 438/106 |
| 6,744,112 | B2 | * | 6/2004 | Johnson et al. | 257/491 |
| 6,921,959 | B2 | * | 7/2005 | Watanabe | 257/531 |
| 6,943,063 | B2 | * | 9/2005 | Tsai et al. | 438/118 |
| 6,967,392 | B2 | | 11/2005 | Tsai et al. | |
| 7,005,708 | B2 | * | 2/2006 | Mergens et al. | 257/360 |
| 7,087,496 | B2 | * | 8/2006 | Gutierrez | 438/294 |
| 7,202,114 | B2 | * | 4/2007 | Salcedo et al. | 438/133 |
| 7,253,487 | B2 | * | 8/2007 | Chen | 257/409 |
| 7,265,438 | B2 | | 9/2007 | Tsai et al. | |
| 7,350,160 | B2 | * | 3/2008 | Perez et al. | 716/119 |
| 7,466,284 | B2 | * | 12/2008 | Barry | 343/867 |
| 7,550,850 | B2 | * | 6/2009 | Nakashiba | 257/758 |
| 7,582,938 | B2 | * | 9/2009 | Chen | 257/357 |
| 7,602,065 | B2 | * | 10/2009 | Hou et al. | 257/758 |
| 7,629,656 | B2 | * | 12/2009 | Hasegawa et al. | 257/409 |
| 7,652,344 | B2 | * | 1/2010 | Uchida | 257/508 |
| 7,675,143 | B2 | * | 3/2010 | Kadoyama et al. | 257/659 |
| 7,893,459 | B2 | * | 2/2011 | Wang et al. | 257/170 |
| 7,898,027 | B2 | | 3/2011 | Cheng | |

(Continued)

*Primary Examiner* — Ida M Soward

(74) *Attorney, Agent, or Firm* — Winston Hsu; Scott Margo

(57) ABSTRACT

A seal ring structure disposed along a periphery of an integrated circuit. The seal ring is divided into at least a first portion and a second portion. The second portion is positioned facing and shielding an analog and/or RF circuit block from a noise. A deep N well is disposed in a P substrate and is positioned under the second portion. The deep N well reduces the substrate noise coupling.

25 Claims, 6 Drawing Sheets

U.S. PATENT DOCUMENTS

| | | |
|---|---|---|
| 2002/0164851 A1* | 11/2002 | Wu et al. .................. 438/215 |
| 2006/0118904 A1 | 6/2006 | Liaw |
| 2006/0267132 A1* | 11/2006 | Lee .......................... 257/509 |
| 2007/0001004 A1* | 1/2007 | Mallikarjunaswamy et al. ........................ 235/435 |
| 2007/0152275 A1 | 7/2007 | Ker |
| 2008/0061397 A1* | 3/2008 | Uchida ..................... 257/508 |
| 2008/0230873 A1* | 9/2008 | Demircan et al. ......... 257/620 |
| 2009/0201043 A1* | 8/2009 | Kaltalioglu ............... 324/765 |

\* cited by examiner

SEAL RING STRUCTURE FOR INTEGRATED CIRCUITS

CROSS REFERENCE TO RELATED APPLICATIONS

This application claims the benefit of U.S. provisional application No. 61/057,185, filed May 29, 2008.

BACKGROUND OF THE INVENTION

1. Field of the Invention

The present invention related to semiconductor devices and, more particularly, to a seal ring structure for an integrated circuit that is capable of reducing substrate noise coupling.

2. Description of the Prior Art

Advances in fabrication technology have enabled entire functional blocks, which previously had been implemented as plural chips on a circuit board, to be integrated onto a single IC. One particularly significant development is mixed-signal circuits, which combine analog circuitry and digital logic circuitry onto a single IC.

However, a major technical hurdle to implementing mixed-signal circuits has been the coupling of noise between different portions of the IC, for example, from the digital to the analog portions. Ordinarily, an integrated circuit chip includes a seal ring used to protect it from moisture degradation or ionic contamination. Typically, the seal ring is made of a stack of metal and contact/via layers and is manufactured step by step as sequential depositions of insulators and metals in conjunction together with the fabrication of the integrated circuit elements.

It has been found that the noise, such as digital noise, which, for example, may be originated from a digital power signal line such as $V_{DD}$ or signal pad of a digital circuit, propagates through the seal ring and adversely affects the performance of the sensitive analog and/or RF circuit.

SUMMARY OF THE INVENTION

It is one object of the present invention to provide an improved seal ring structure of an integrated circuit chip, which is capable of reducing the digital noise coupling from a digital circuit.

The above object will be achieved by the seal ring structure in the present invention which comprises a seal ring disposed along a periphery of the integrated circuit, wherein the seal ring is divided into at least a first portion and a second portion, and wherein the second portion is positioned facing and shielding an analog and/or RF circuit block from a noise; and a deep N well in a P substrate and positioned under the second portion.

In one aspect, the present invention provides a seal ring structure for an integrated circuit including a seal ring disposed along a periphery of the integrated circuit, wherein the seal ring is divided into at least a first portion and a second portion; a first deep N well in a P substrate and positioned under the first portion; and a second deep N well in a P substrate and positioned under the second portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to a seal ring structure for an integrated circuit chip. The number of seal ring(s) in the seal ring structure depends on requirements and is not limited to what is illustrated in the embodiments. If there is an outer seal ring, it may be a continuous ring, while an inner seal ring may be divided into at least two portions including a conductive rampart that is situated in front of a sensitive analog and/or RF circuit block of the integrated circuit chip.

A deep N well under the conductive rampart may shield the analog and/or RF circuit from noise, which, for example, propagates through the outer seal ring, thereby reducing the noise-coupling effects. The continuous outer seal ring keeps the moisture and corrosive substances from entering the IC.

Figure 1:
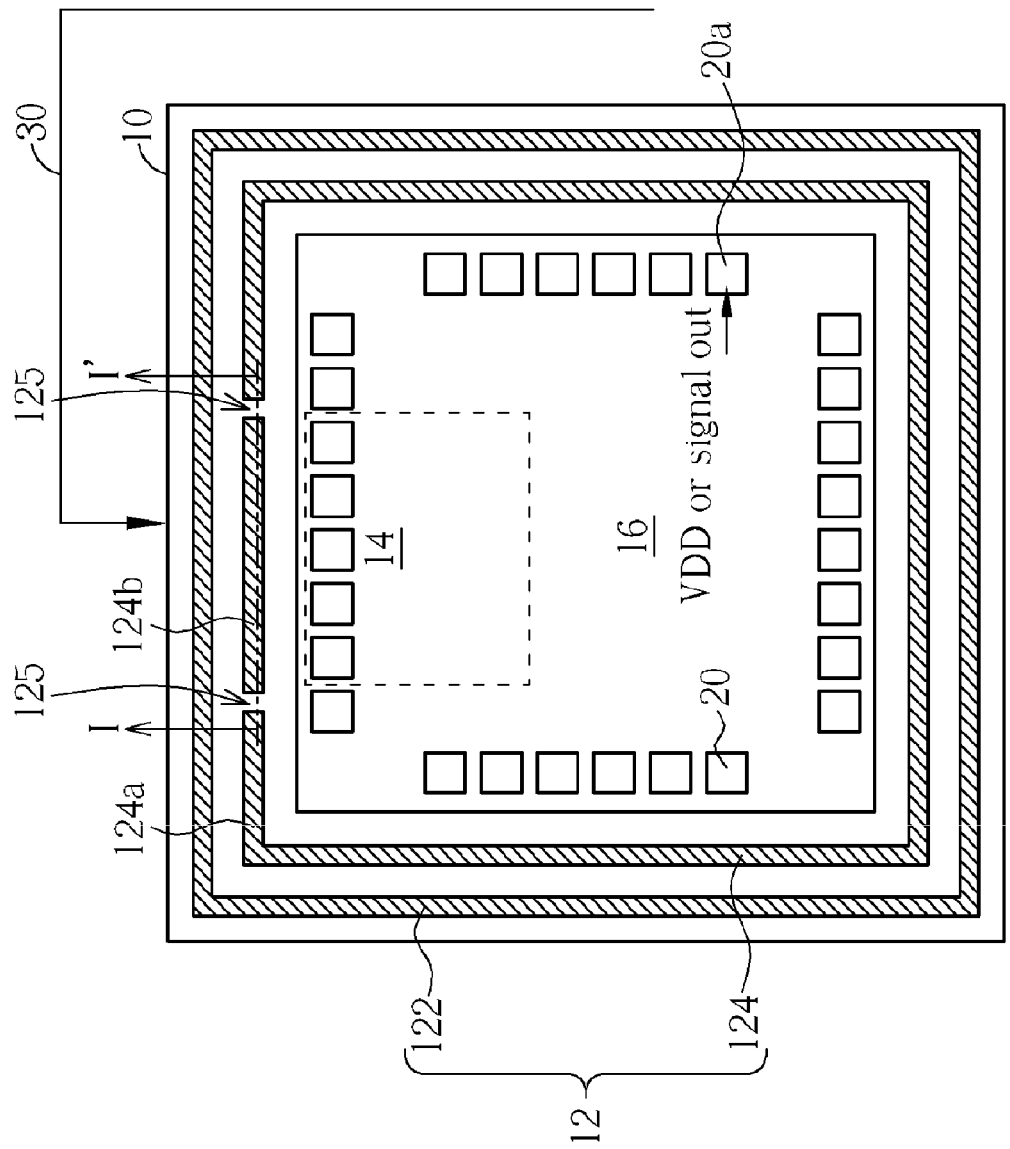
FIG. 1 is a schematic, planar view of an integrated circuit chip with a double seal ring structure in accordance with one preferred embodiment of this invention.
Figure 2:
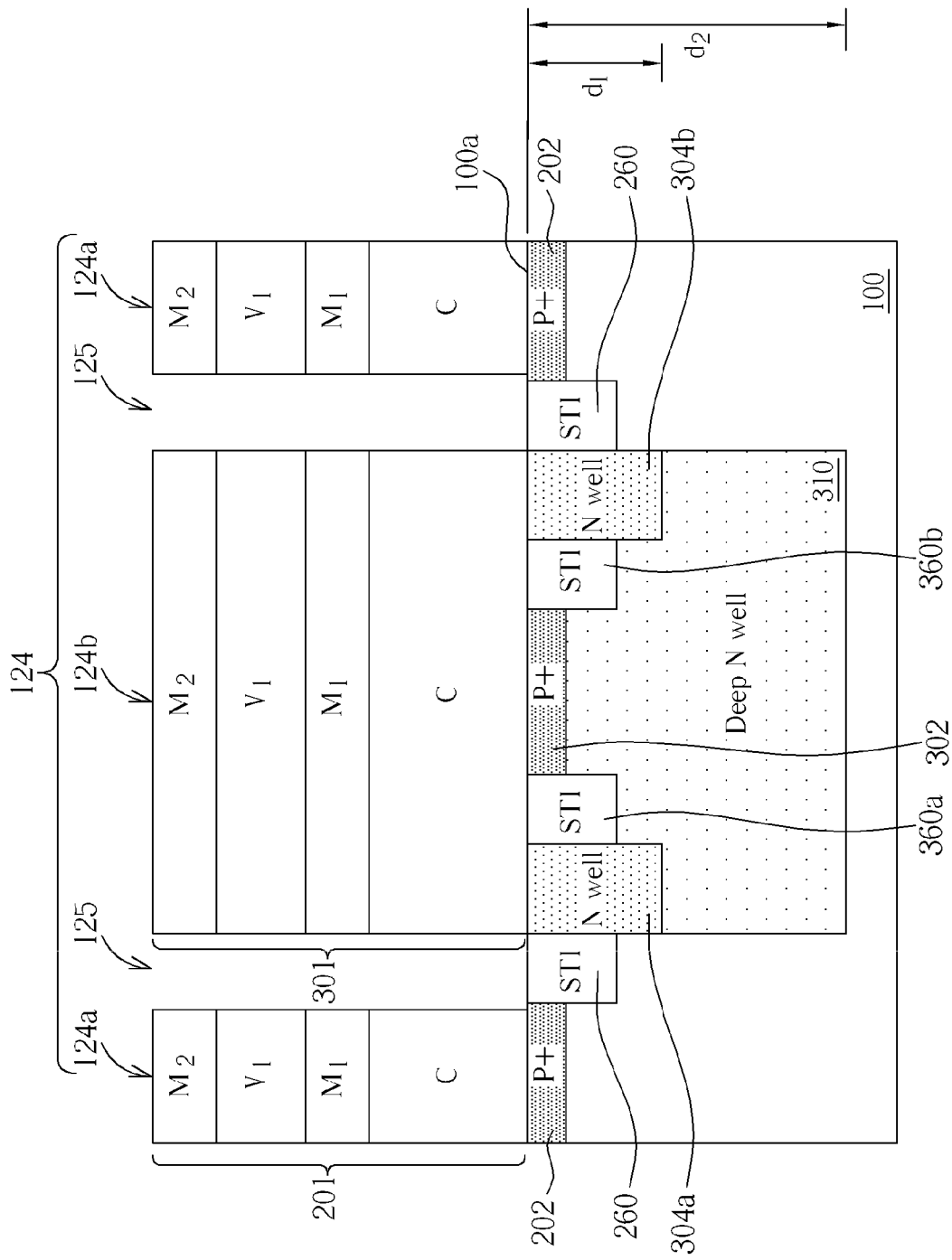
FIG. 2 is a schematic, cross-sectional view taken along line I-I' of FIG. 1.

Please refer to FIG. 1 and FIG. 2. FIG. 1 is a schematic, planar view of an integrated circuit chip 10 with a double seal ring structure 12 in accordance with one embodiment of this invention. FIG. 2 is a schematic, cross-sectional view taken along line I-I' of FIG. 1. As shown in FIG. 1, the integrated circuit chip 10 comprises at least one analog and/or RF circuit block 14, a digital circuit 16 and a double seal ring structure 12 surrounding and protecting the analog and/or RF circuit block 14 and digital circuit 16.

The integrated circuit chip 10 further comprises a plurality of input/output (I/O) pads 20. As previously described, noises such as those originated from a digital power $V_{DD}$ signal line or a signal output pad 20a of the digital circuit 16 can propagates through the seal ring and adversely affects the performance of the sensitive analog and/or RF circuit 14. The noise propagation path 30 is specifically indicated in FIG. 1. The present invention aims to tackle this problem.

According to the present invention, the double seal ring structure 12, which is disposed along the periphery of the chip, includes a continuous outer seal ring 122 and a discontinuous inner seal ring 124. Though a double seal ring structure 12 is shown in this embodiment, the number of seal ring(s) in the seal ring structure depends on requirements and is not limited to what is illustrated herein. Besides, though the outer seal ring 122 is continuous and the inner seal ring 124 is discontinuous in this embodiment, the outer one could be either continuous or discontinuous, and the inner one could be either continuous or discontinuous as well. The inner seal ring 124 is divided into at least two portions including a first portion 124a and a second portion 124b spaced apart from the first portion 124a. Between the first portion 124a and the second portion 124b, there is provided a chipped region 125.

As shown in FIG. 2, the first portion 124a and the second portion 124b are different from each other mainly underneath the main surface 100a of the P substrate 100. The first portion 124a comprises a conductive rampart 201 that is made of a stack of metal layers such as M1 and M2 and contact/via layers such as C and V1 and is manufactured step by step as sequential depositions of insulators and metals in conjunction together with the fabrication of the integrated circuit elements. The first portion 124a further comprises a P$^+$ region 202 situated under the conductive rampart 201. There may be a P well (not shown) under the P$^+$ region 202.

The second portion 124b is positioned facing the analog and/or RF circuit block 14 for shielding the noise propagating through the continuous outer seal ring 122. Preferably, the length of the second portion 124b is equal to or greater than the span of the shielded analog and/or RF circuit block 14. Above the main surface 100a of the P substrate 100, likewise, the second portion 124b comprises a conductive rampart 301 that is made of a stack of metal layers such as M1 and M2 and contact/via layers such as C and V1 and is manufactured step by step as sequential depositions of insulators and metals in conjunction together with the fabrication of the integrated circuit elements.

The present invention features the seal ring structure underneath the main surface 100a of the P substrate 100. Under the conductive rampart 301, the second portion 124b further comprises a P$^+$ region 302, a first N well 304a electrically isolated from the P$^+$ region 302 by a first shallow trench isolation (STI) structure 360a, a second N well 304b electrically isolated from the P$^+$ region 302 by a second STI structure 360b, and a deep N well 310, wherein the P$^+$ region 302, the first N well 304a, the second N well 304b, the first and second STI structures 360a and 360b are formed on/over the deep N well 310. The first and second N wells 304a and 304b are electrically isolated from the P$^+$ region 202 by an STI structure 260.

According to the preferred embodiment, the first and second N wells 304a and 304b have a junction depth $d_1$ of about 11000-15000 angstroms and the deep N well 310 has a junction depth $d_2$ of about 19000-21000 angstroms. The deep N well 310 may be grounded or coupled to a supply voltage, such as $V_{DD}$. It is advantageous to use the present invention because the deep N well 310 situated under the second portion 124b can reduce the substrate noise coupling.

Figure 3:
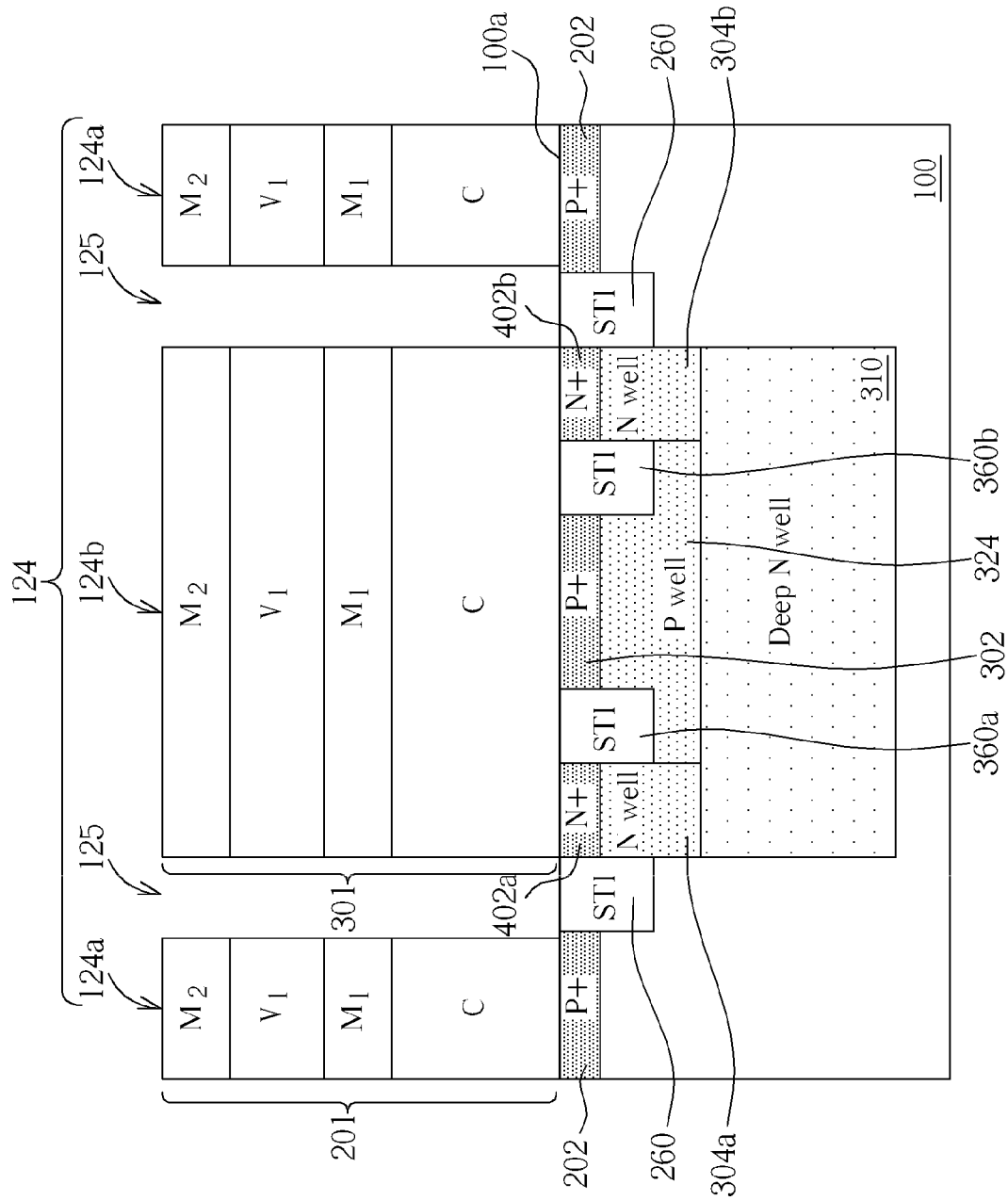
FIG. 3 is a schematic, cross-sectional view demonstrating another embodiment of this invention.

FIG. 3 is a schematic, cross-sectional view demonstrating another embodiment of this invention. As shown in FIG. 3, likewise, under the conductive rampart 301, the second portion 124b comprises a P$^+$ region 302, a first N well 304a electrically isolated from the P$^+$ region 302 by a first STI structure 360a, a second N well 304b electrically isolated from the P$^+$ region 302 by a second STI structure 360b, and a deep N well 310, wherein the P$^+$ region 302, the first N well 304a, the second N well 304b, the first and second STI structures 360a and 360b are formed on/over the deep N well 310. The first and second N wells 304a and 304b are electrically isolated from the P$^+$ region 202 by an STI structure 260. In addition, a P well 324 is provided between the P$^+$ region 302 and the deep N well 310. The second portion 124b further comprises N$^+$ regions 402a and 402b.

Figure 4:
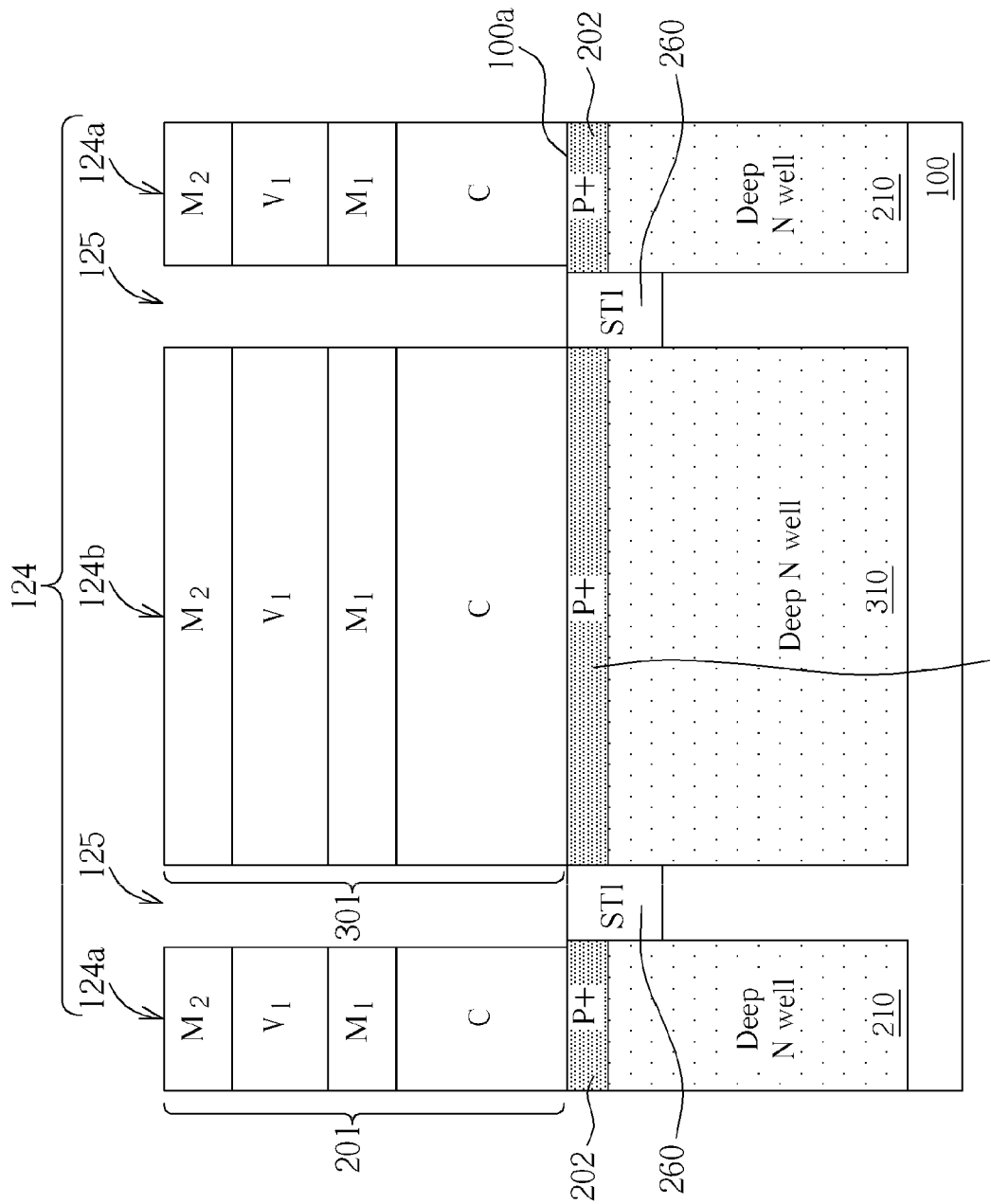
FIG. 4 is a schematic, cross-sectional view illustrating yet another embodiment of this invention.

FIG. 4 is a schematic, cross-sectional view illustrating yet another embodiment of this invention. As shown in FIG. 4, under the conductive rampart 201 of the first portion 124a of the inner seal ring 124, a deep N well 210 is provided under the P$^+$ region 202. Under the conductive rampart 301 of the second portion 124b of the inner seal ring 124, merely a P$^+$ region 302 and a deep N well 310 are provided. The STI structures 360a and 360b and the first and second N wells 304a and 304b in FIG. 2 are omitted.

Figure 5:
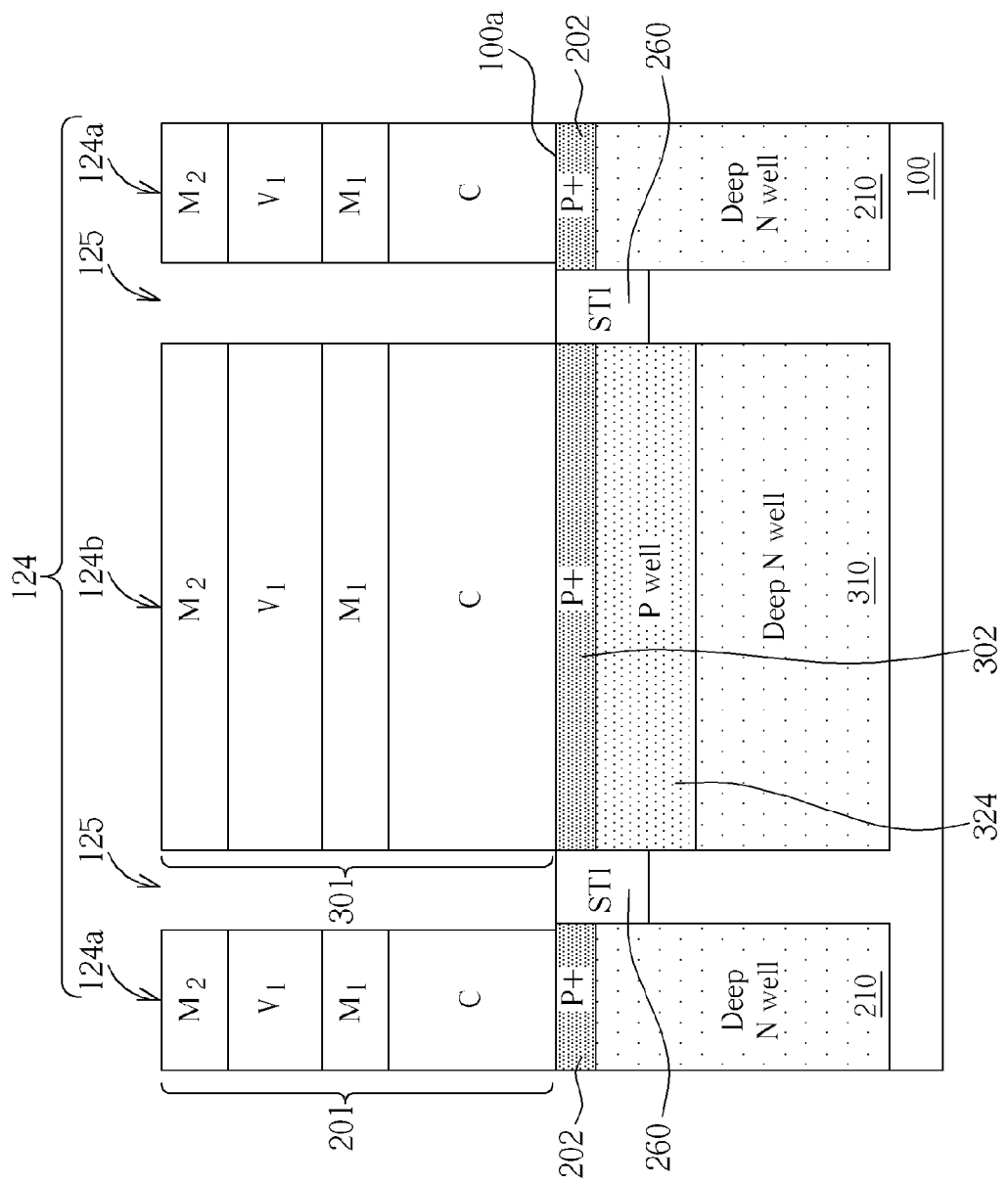
FIG. 5 is a schematic, cross-sectional view illustrating yet another embodiment of this invention.

FIG. 5 is a schematic, cross-sectional view illustrating yet another embodiment of this invention. As shown in FIG. 5, likewise, under the conductive rampart 201 of the first portion 124a of the inner seal ring 124, a deep N well 210 is provided under the P$^+$ region 202. Under the conductive rampart 301 of the second portion 124b of the inner seal ring 124, a P$^+$ region 302, a P well 324 and a deep N well 310 are provided. The STI structures 360a and 360b and the first and second N wells 304a and 304b in FIG. 2 are omitted.

Figure 6:
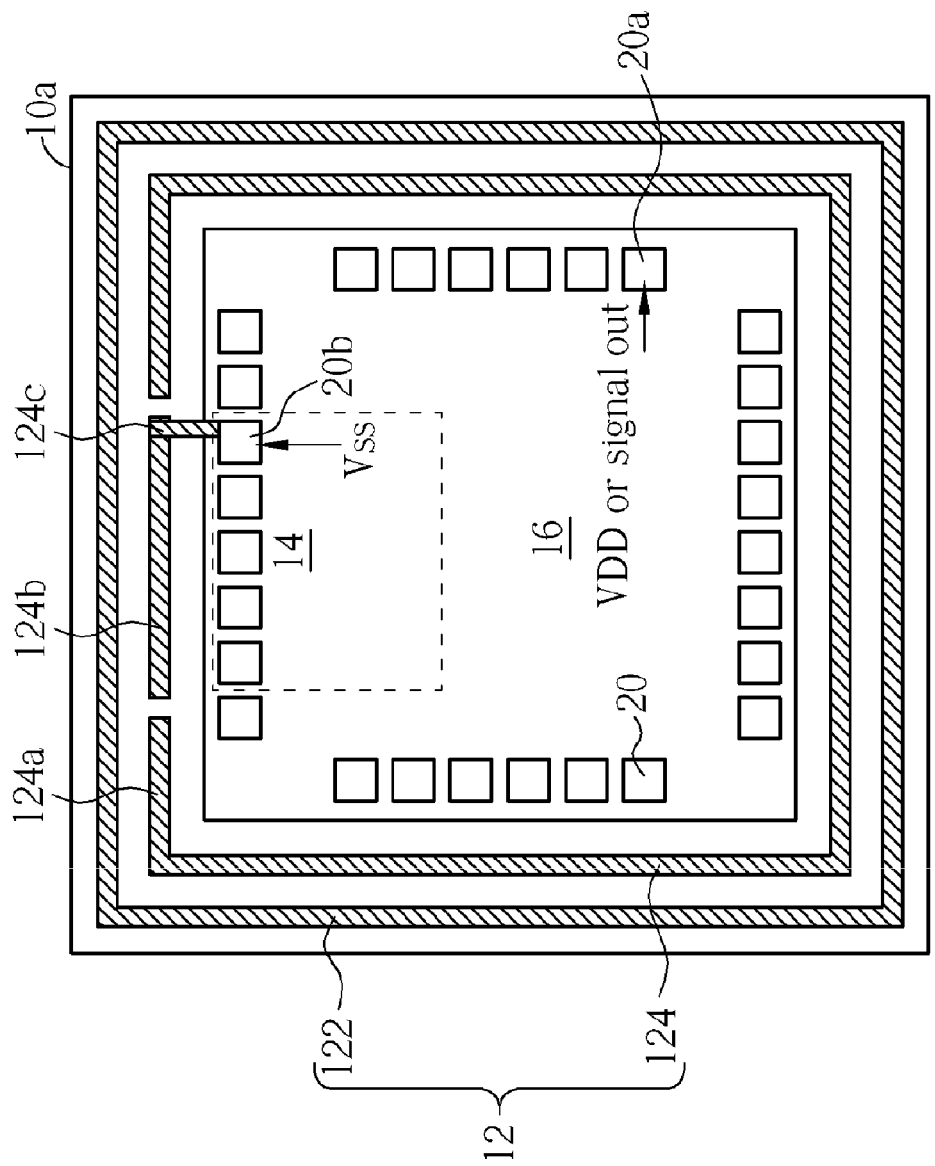
FIG. 6 is a schematic, planar view of an integrated circuit chip with a double seal ring structure in accordance with another preferred embodiment of this invention.

FIG. 6 is a schematic, planar view of an integrated circuit chip 10a with a double seal ring structure 12 in accordance with another preferred embodiment of this invention, wherein like numeral numbers designate like regions, layers or elements. As shown in FIG. 6, likewise, the integrated circuit chip 10a comprises at least one analog and/or RF circuit block 14, a digital circuit 16 and a double seal ring structure 12 surrounding and protecting the analog and/or RF circuit block 14 and digital circuit 16. The integrated circuit chip 10a further comprises a plurality of I/O pads 20. Noises such as those originated from a digital power $V_{DD}$ signal line or a signal output pad 20a of the digital circuit 16 propagates through the seal ring and adversely affects the performance of the sensitive analog and/or RF circuit block 14.

The double seal ring structure 12 includes a continuous outer seal ring 122 and a discontinuous inner seal ring 124. Though a double seal ring structure 12 is shown in this embodiment, the number of seal ring(s) in the seal ring structure depends on requirements and is not limited to what is illustrated herein. Besides, though the outer seal ring 122 is continuous and the inner seal ring 124 is discontinuous in this embodiment, the outer one could be either continuous or discontinuous, and the inner one could be either continuous or discontinuous as well. The inner seal ring 124 is divided into two portions including a first portion 124a and a second portion 124b. The second portion 124b serves to shield the noise propagating through the outer seal ring 122. Preferably, the length of the second portion 124b is equal to or greater than the span of the shielded analog and/or RF circuit block 14.

The ring structure of the second portion 124b is similar to that as set forth in FIG. 2 or FIG. 3. According to this invention, the second portion 124b may be coupled to an independent ground or an independent supply voltage. According to this invention, the second portion 124b may be coupled to the independent ground through an independent pad and an interconnection trace. The term "independent" used herein means that the ground, pad or supply voltage is not commonly used by the analog circuit, RF circuit or digital circuit.

In this embodiment, the second portion 124b may be coupled to an independent pad 20b through an interconnection trace 124c. The interconnection trace 124c may be comprised of a topmost metal layer of the integrated circuit chip 10a and an aluminum layer (not shown). By doing this, the second portion 124b could be coupled to an independent ground (not shown) or an independent supply voltage, such as $V_{SS}$, and the noise coupling can be significantly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A seal ring structure for an integrated circuit, comprising:
   a seal ring disposed along a periphery of the integrated circuit, wherein the seal ring is divided into at least a first portion and a second portion, and wherein the second portion is positioned facing and shielding an analog and/or RF circuit block from a noise, wherein the first portion is aligned with the second portion along the periphery of the integrated circuit; and
   a deep N well in a P substrate and positioned under the second portion.

2. The seal ring structure according to claim 1 wherein the seal ring is discontinuous, the second portion is spaced apart from the first portion.

3. The seal ring structure according to claim 1 further comprising a continuous outer seal ring outside the seal ring.

4. The seal ring structure according to claim 1 wherein a length of the second portion is equal to or greater than a span of the shielded analog and/or RF circuit block.

5. The seal ring structure according to claim 1 wherein the first portion comprises a first $P^+$ region in the P substrate.

6. The seal ring structure according to claim 1 wherein the second portion comprises a second $P^+$ region in the deep N well.

7. The seal ring structure according to claim 6 further comprising a P well between the second P+ region and the deep N well.

8. The seal ring structure according to claim 6 wherein the second portion further comprises a first N well electrically isolated from the second $P^+$ region by a first shallow trench isolation (STI) structure, a second N well electrically isolated from the second $P^+$ region by a second STI structure.

9. The seal ring structure according to claim 8 wherein the first and second N wells have a junction depth $d_1$ of about 11000-15000 angstroms and the deep N well has a junction depth $d_2$ of about 19000-21000 angstroms.

10. The seal ring structure according to claim 8 wherein the first N well and the second N well are coupled to the deep N well.

11. The seal ring structure according to claim 1 wherein the second portion comprises an $N^+$ region in the deep N well.

12. The seal ring structure according to claim 1 wherein the deep N well is grounded or coupled to a supply voltage.

13. The seal ring structure according to claim 1 wherein the second portion comprises a conductive rampart that is a stack comprising a metal layer, a contact/via layer or a combination thereof and is manufactured together with the fabrication of the integrated circuit.

14. A seal ring structure for an integrated circuit, comprising:
   a seal ring disposed along a periphery of the integrated circuit, wherein the seal ring is divided into at least a first portion and a second portion;
   a first deep N well in a P substrate and positioned under the first portion; and
   a second deep N well in the P substrate and positioned under the second portion.

15. The seal ring structure according to claim 14 wherein the seal ring is discontinuous, the second portion is spaced apart from the first portion.

16. The seal ring structure according to claim 14 further comprising a continuous outer seal ring outside the seal ring.

17. The seal ring structure according to claim 14 wherein a length of the second portion is equal to or greater than a span of an analog and/or RF circuit block of the integrated circuit.

18. The seal ring structure according to claim 17 wherein the second portion is positioned facing and shielding the analog and/or RF circuit block from a noise.

19. The seal ring structure according to claim 14 wherein the first portion comprises a first $P^+$ region in the first deep N well.

20. The seal ring structure according to claim 14 wherein the second portion comprises a second $P^+$ region in the second deep N well.

21. The seal ring structure according to claim 20 further comprising a P well between the second $P^+$ region and the second deep N well.

22. The seal ring structure according to claim 20 wherein the second portion further comprises a first N well electrically isolated from the second $P^+$ region by a first shallow trench isolation (STI) structure, a second N well electrically isolated from the second $P^+$ region by a second STI structure.

23. The seal ring structure according to claim 22 wherein the first and second N wells have a junction depth $d_1$ of about 11000-15000 angstroms and the second deep N well has a junction depth $d_2$ of about 19000-21000 angstroms.

24. The seal ring structure according to claim 22 wherein the first N well and the second N well are coupled to the second deep N well.

25. The seal ring structure according to claim 14 wherein the second deep N well is grounded or coupled to a supply voltage.

* * * * *